United States Patent [19]
Sutherland et al.

[11] Patent Number: 5,543,640
[45] Date of Patent: Aug. 6, 1996

[54] LOGICAL THREE DIMENSIONAL INTERCONNECTIONS BETWEEN INTEGRATED CIRCUIT CHIPS USING A TWO DIMENSIONAL MULTI-CHIP MODULE

[75] Inventors: James Sutherland, Santa Clara; Timothy L. Garverick, Cupertino; Hem P. Takiar, Fremont; George F. Reyling, Jr., Saratoga, all of Calif.

[73] Assignee: National Semiconductor Corporation, Santa Clara, Calif.

[21] Appl. No.: 536,076

[22] Filed: Sep. 29, 1995

Related U.S. Application Data

[63] Continuation of Ser. No. 213,146, Mar. 15, 1994, abandoned.

[51] Int. Cl.$^6$ ..................................................... H01L 27/10
[52] U.S. Cl. .......................... 257/202; 257/203; 257/207; 257/208
[58] Field of Search ..................................... 257/203, 723, 257/202, 208, 207

[56] References Cited

U.S. PATENT DOCUMENTS

| | | | |
|---|---|---|---|
| 4,467,400 | 8/1984 | Stopper | 257/203 |
| 4,864,381 | 9/1989 | Seefeldt et al. | 257/208 |
| 5,229,629 | 7/1993 | Koike | 257/208 |
| 5,257,166 | 10/1993 | Mauri et al. | 257/723 |

FOREIGN PATENT DOCUMENTS

| | | | |
|---|---|---|---|
| 0475269 | 3/1992 | European Pat. Off. . | |
| 0475269A2 | 3/1992 | European Pat. Off. | H01L 23/498 |
| 0592111 | 4/1994 | European Pat. Off. . | |
| 05592111A2 | 4/1994 | European Pat. Off. | H01L 23/522 |

OTHER PUBLICATIONS

Technology Products, *C4 Product Design Manual*, "vol. I: Chip and Wafer Design", IBM, pp: cover, iii through xii, 1—1 through 10–6, and A–1 through A–12, from IBM.*.
Dobbelaere, I. et al., "Field Programmable MCM Systems—Design of an Interconnection Frame," *Proceedings of the Custom Integrated Circuits Conference*, No. 14 (May 1992), pp. 461–464.*.

*Primary Examiner*—William Mintel
*Assistant Examiner*—Roy Potter
*Attorney, Agent, or Firm*—Limbach & Limbach L.L.P.

[57] ABSTRACT

A high capacity gate array which incorporates an effectively three dimensional interconnect network. The array is formed from multiple smaller arrays which are connected to a common substrate by means of flip-chip bonding. The substrate is typically a multi-layer substrate which has interconnect lines embedded on or within it, thereby allowing a set of desired interconnections between the smaller logic cell arrays to be implemented. The contact points for connecting logic cells or arrays of cells to the substrate result from placing a multitude of solder bumps on the smaller arrays of logic cells at desired interconnect points. Connecting the interconnect point solder bumps to the multi-layer substrate then permits the individual logic cell arrays to be interconnected in a desired manner. A three dimensional interconnect network is realized by interconnecting corresponding points on different logic cell arrays so that the arrays are connected in parallel. This has the effect of producing a three dimensional interconnect network from a two dimensional arrangement of arrays or chips in a MCM package. The result is a high gate capacity logic device having an increased degree of gate utilization and shortened average interconnect distances, thereby enabling the production of complex devices which have a faster operating speed.

15 Claims, 8 Drawing Sheets

LOGICAL THREE DIMENSIONAL INTERCONNECTIONS BETWEEN INTEGRATED CIRCUIT CHIPS USING A TWO DIMENSIONAL MULTI-CHIP MODULE

This is a continuation of application Ser. No. 08/213,146 filed on Mar. 15, 1994, now abandoned.

TECHNICAL FIELD

The present invention is generally directed to techniques for interconnecting and packaging multiple integrated circuit chips in order to form more complex devices, and more specifically, to a high capacity logic device having an increased interconnect capacity and effectively a three dimensional interconnect network, which is based on a variation of standard two dimensional multi-chip module packaging methods.

BACKGROUND OF THE INVENTION

As integrated circuit devices become more complex, interconnect and packaging technology becomes of greater importance to the design of such devices. This is because the interconnect and packaging technology used in a device can have a great affect on its functional capacity and utility.

Interconnection techniques are used to electrically connect multiple smaller functional units into more complex devices and to connect individual and multiple groups of smaller units to the package in which they will be contained. Interconnection methods are important because they affect the speed at which devices operate, the surface area required for the device, and the reliability of the device over an extended period of time. Packaging methods are also important because they affect the speed, cost and reliability of the device and provide the device with power and input signals. Due to the desire to increase the capacity of devices while maintaining a high level of reliability and minimizing cost, the interconnect and packaging technology used in manufacturing a particular device is an important consideration in the device's design.

A common method of producing a complex device from multiple individual devices is to use Multi-Chip Module (MCM) packaging technology. MCM technology combines two or more individual integrated circuit (IC) dice or chips into a single package which is capable of performing more complex functions than a single IC chip. The individual chips are mounted on a common substrate and connected to the substrate (and to each other by virtue of the interconnect network on or within the substrate) and to package contacts by one of several methods, for example, wire bonding or solder bump technology. Wire bonding involves connecting bonding pads or contacts on an IC chip to a lead frame or to pads or contacts on other chips with fine wires. Interconnections between contacts on different IC chips can also be carried out by soldering connecting wires between them or using metal interconnect lines.

While using fine wires or metal interconnect lines to interconnect IC chips to any desired degree is possible in theory, the number of interconnections required is often not practical because of constraints on the space available for routing interconnect wires or lines, the need to limit the number of interconnections in order to prevent short circuits, and because capacitive and inductive coupling between the wires or lines can degrade performance. Owing to these considerations, efforts have been made to optimize interconnect schemes and to develop other methods for interconnecting multiple IC chips into a larger and functionally more complex device.

As mentioned, individual chips can also be mounted on a common substrate by using solder bump or flip-chip technology. In this method, solder bumps are placed on the die and the chip is flipped over, placing the solder bumps in contact with conductive pads on the substrate. The solder is then reflowed, establishing a good electrical contact. The individual chips are again interconnected to each other using an interconnect network embedded on or within the substrate.

An example of a MCM technology which is suited for applications requiring a large number of interconnections between the individual chips and which uses such an interconnect network is Area Array technology. In this packaging method, connections are made from the interior of one chip to another through interconnect lines embedded on or within a multi-layer MCM substrate. The interconnect layers of the substrate are accessed through arrays of conductive pads which are designed to correspond to the positions of the metal bumps on chips used in flip-chip packaging methods. The metal bumps are soldered to the array pads to electrically connect the chips to each other.

The need for additional interconnect capacity beyond that obtainable using wire bonding or metal interconnect lines is especially critical when interconnecting arrays of logic cells or chips composed of multiple logic cell arrays into larger and more complex devices. Since logic cell arrays typically require a large number of connections in order for the smaller arrays to be combined into a higher capacity logic device, as the final array becomes larger, a barrier to further expansion is quickly reached. This is because of the need to avoid the inherent problems with wire bonding or metal interconnect lines mentioned above. The result is that the array is constrained to either being small, but limited in complexity, or complex, but larger and more expensive than may be desired for a given application.

A method of forming a large scale integrated circuit by stacking two or more layers of chips onto each other and interconnecting them via wire bonding is described in Japanese Patent Application Disclosure No. 1-28856, corresponding to Application No. 62-182307, entitled "Multilayered Integrated Circuit", filed Jul. 23, 1987 and naming Takeuchi as the inventor. While this disclosure describes a means of combining two or more IC chips to provide a larger circuit, the use of wire bonding to interconnect the chips makes the package liable to the space availability, short circuit and capacitive and inductive coupling problems noted above. Thus, the interconnect capacity of such a device is severely limited.

U.S. patent application Ser. No. 08/190,910, entitled "Extendible Circuit Architecture", which is assigned to the same Assignee as the present application and lists as inventor one of the inventors of this application, describes and claims a high gate capacity programmable module for which the semiconductor material cost increases linearly with gate capacity, and is hereby incorporated by reference to provide additional background information regarding the present application. The module is manufactured by taking a single device having a two dimensionally extendible architecture and utilizing it in a packaging method based on Area Array technology. The result is that multiple individual chips are interconnected into a single, larger device by means of a MCM packaging technique. Because each individual chip is two dimensionally extendible, the resulting larger capacity device is functionally equivalent to the smaller devices from which it is made. The final device has substantially the same architecture, but an increased gate capacity when compared to the smaller devices.

While both the two dimensionally extendible architecture described above and other MCM packaging methods permit the manufacture of more cost-effective high capacity devices, a problem relating to the interconnect network used in such devices still exists. This problem concerns the propagation delays introduced by routing signals to the periphery of a die or chip before interconnections are made to other elements. Such routing can vastly decrease the operating speed of a device since a signal may have to propagate along excessively long paths or through extraneous circuit elements prior to being received at its intended destination.

What is desired is a method of interconnecting multiple smaller logic cell arrays or chips into a more complex device using an interconnect method which reduces the average interconnect distance between any two smaller elements and overcomes the noted problems associated with wire bonding and other existing interconnect schemes.

SUMMARY OF THE INVENTION

The present invention is directed to a high capacity gate array which incorporates an effectively three dimensional interconnect network. The array is formed from multiple smaller arrays which are connected to a common substrate by means of flip-chip bonding. The substrate is typically a multi-layer substrate which has interconnect lines embedded on or within it, thereby allowing a set of desired interconnections between the smaller logic cell arrays to be implemented. The contact points for connecting logic cells or arrays of cells to the substrate result from placing a multitude of solder bumps on the smaller arrays of logic cells at desired interconnect points. Connecting the interconnect point solder bumps to the multi-layer substrate then permits the individual logic cell arrays to be interconnected in a desired manner.

In a preferred embodiment of the invention, the placement of the solder bumps and pattern of the interconnect layers of the substrate are designed to permit equivalent points on different logic cell arrays to be connected together in parallel. This has the effect of producing a three dimensional interconnect network from a two dimensional arrangement of arrays or chips contained in a MCM package. The result is a high gate capacity logic device having an increased degree of gate utilization (the ratio of logic gates used to gates available) and reduced average interconnect distances, thereby enabling the production of complex devices which have a faster operating speed.

Further objects and advantages of the present invention will become apparent from the following detailed description and accompanying drawings.

DESCRIPTION OF THE PREFERRED EMBODIMENT

Figure 1A:
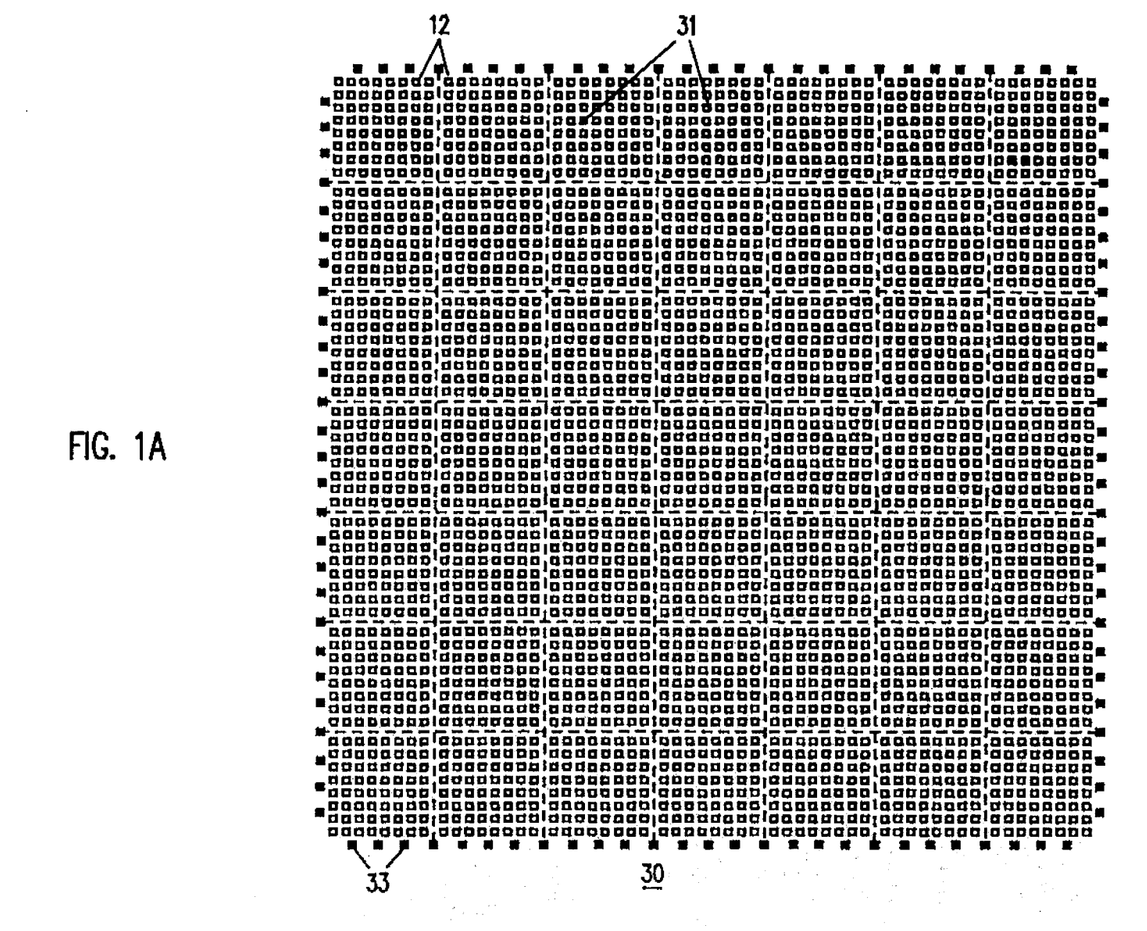
FIGS. 1A–1C illustrate some of the features of a logic cell array or chip composed of such arrays which is suitable for use in accordance with the present invention.
Figure 1B:
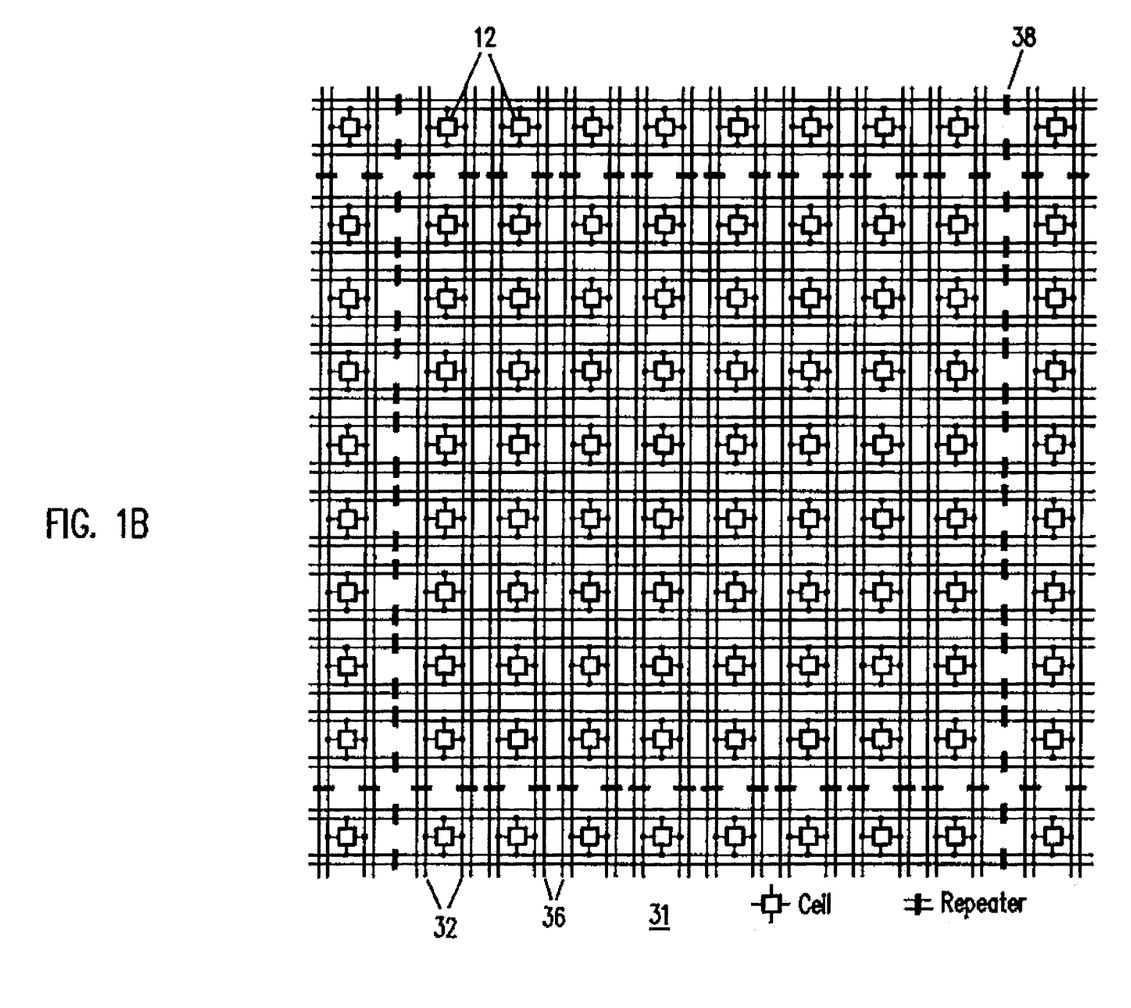
Figure 1C:
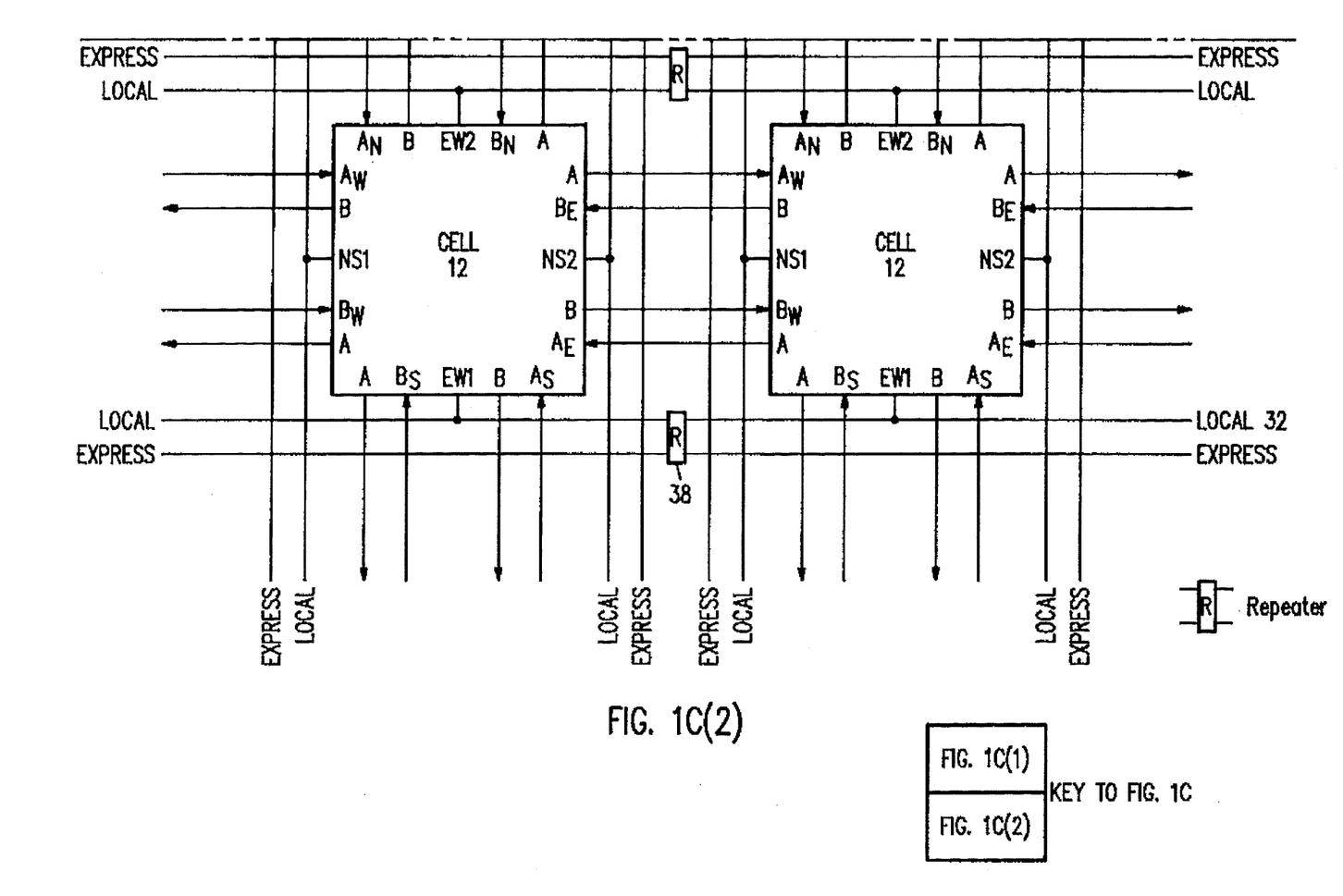

Referring to the figures, and in particular to FIGS. 1A–1C, which illustrate some of the features of a logic cell array or chip composed of such arrays which is suitable for use in accordance with the present invention. The example shown in FIGS. 1A–1C has an "extendible" architecture which means that the architecture is scalable so that multiple smaller functional units may be combined to produce a device having a higher capacity, but improved functionality and a similar architecture as its component units. In the present application, the concept of extendibility means that the chip architecture is such that individual chips or arrays of logic cells can be combined into more complex devices by interconnecting a location on one chip or array to the equivalent or corresponding location on a different chip or array. This provides a three dimensional interconnect network and defines a form of three dimensional extendibility. A benefit of such extendibility is that the average interconnect line length between any two elements on different die is minimized, thereby attempting to optimize the overall operating speed of the final device.

The example of an extendible architecture shown in FIGS. 1A–1C is a configurable logic array (CLA), in particular, the CLAy family of configurable logic array chips produced by National Semiconductor Corporation of Santa Clara, Calif. The architecture and operation of the CLAy family of devices is described in allowed U.S. patent application Ser. No. 08/044,921, which is assigned to the Assignee of the present application and is hereby incorporated by reference. The CLAy family of chips are a subset of the larger set of field-programmable-gate-array (FPGA) chips, some of which are also suitable for use in accordance with the present invention. Another type of device having an extendible architecture and which can be used in accordance with the present invention is a mask programmable gate array. In addition, combinations of some types of chips can be extendible to the degree desired for the present application, for example FPGA and static random-access memory (SRAM) chip combinations.

As shown in FIG. 1A, the architecture of a CLAy configurable logic array chip consists of a two-dimensional matrix 30 formed by tiling multiple smaller arrays 31 of interconnected, programmable logic cells 12. In FIG. 1A, matrix 30 is a 7×7 array of smaller arrays 31, where each smaller array 31 is an 8×8 array of logic cells 12. Input/output (I/O) drivers 33 located on the edges of matrix 30 assist in sending signals into or out of matrix 30. The individual logic function and the active inputs and outputs of each logic cell 12 are determined by parameter memory bits and logic gates within the cell, rather than by physically customizing the array during manufacture. Thus, the individual cell functions and the interconnections between cells are field programmable which provides a wide variety of possible functions. The greater the number of cells in the array, the greater the functional capacity of the CLAy device.

A CLAy may be viewed as an array of programmable logic cells on which a flexible bussing network is superimposed. FIG. 1B is a close-up view of one of the 8×8 arrays 31 of logic cells 12 contained in matrix 30. Although logic cells 12 can be used for routing signals, this can result in unacceptably long delays when done over long distances. To address this problem, the interconnections between neighboring cells 12 are augmented with two types of programmable busses: local and express. Thus, connections between individual cells 12 in arrays 30 and 31 are accomplished by buses or by direct connections between adjacent cells.

As shown in FIG. 1B, in the CLAy array, local busses 32 provide connections between the array of cells and the bussing network. Each local bus 32 is connected to every cell 12 in its column or row, thus providing every cell in the array with read/write access to the local bus system.

Express buses 36 provide higher speed transmission of signals and are not connected to every cell. Express busses 36 are designed to speed up signal transfers within arrays 30 and 31, and are the fastest way to cover straight-line distances spanning many cells.

There are two buses of each type described above for each row and each column of logic cells 12 in arrays 30 and 31. Connective units called repeaters 38 are spaced every eight cells 12 and divide each bus into segments spanning eight cells 12. Repeaters 38 are aligned into rows and columns, thereby partitioning array 30 into smaller arrays 31 containing 8×8 blocks of cells 12 called "superblocks". Repeaters 38 serve as programmable switches and can be programmed to provide various connecting functions between similar or different bus types. Typically, a repeater 38 may be composed of one or more switching units, where each switching unit is composed of a programmable signal transmission gate and a buffer. A device's RAM programmable memory (which is either set or reset during the configuration mode) puts the bi-directional signal transmission gate into an open or closed state.

As shown in FIG. 1C, each logic cell 12 receives inputs from and provides outputs to its four adjacent neighbors. Thus, each logic cell 12 in array 31, other than those on the periphery of array 30, receives eight inputs from and provides eight outputs to its North (N), East (E), South (S), and West (W) neighbors. These sixteen inputs and outputs are divided into two types, "A" and "B", with an A input, an A output, a B input and a B output for each neighboring cell 12. Between two different cells 12, an A output is always connected to an A input and a B output is always connected to a B input.

In the CLAy architecture described above, interconnections between adjacent cells 12 are provided by direct interconnections or by buses, where both types of interconnections are typically implemented by means of metal interconnect lines. Interconnections between adjacent superblocks 31 are provided by the busing network and by interconnections between adjacent cells on the periphery of adjacent superblocks. An array of interconnected superblocks 31 forms a CLAy chip or die 30. Multiple dice 30 are interconnected into larger more complex arrays by means of interconnect lines on the periphery of each die. Due to limitations on the surface area available for laying out interconnect lines and concerns regarding cross-talk and coupling, the number of interconnection lines available for interconnecting one die 30 to another such die 30 is limited to approximately 108. This acts to limit the achievable degree of gate utilization and the complexity of the final device which can be constructed for a given amount of active device surface area.

The degree of gate utilization is an important characteristic of gate array based devices because the vast majority of such devices are "random logic" systems where a logic cell is connected to both neighboring and to more distant cells. This is in contrast to "systolic array" systems in which interconnections are only between neighboring cells. For a typical random logic system, the CLAy architecture allows a gate utilization of 15 to 20% of the available cells on a die. This is a result of the limited amount of interconnect wiring resources on a die. It is difficult to use a greater percentage of the available cells because when the limited number of close-by interconnect buses are used up connecting distant cells, other buses must be used to allow additional interconnections. This means that the logic cells near those busses become unavailable for use as active logic cells. In addition, cells may be used as interconnect wires, thereby rendering them unavailable for use as active logic cells. The addition of more logic cells to a die would cause the die size to increase substantially and this may not be cost-effective for some applications. In addition, even if the gross number of cells is increased, the intra-die interconnection constraints still exist.

As noted, the CLAy array 30 has a maximum of 108 possible input/output (I/O) interconnection contacts on its periphery, and with the present architecture, each superblock 31 is connected to its neighboring four superblocks in array 30 by means of 16 local bus 32 and 16 express bus 36 connections per side, for a total of 128 bus connections for internal superblocks with four neighbors. Superblocks on the periphery of array 30 have either 64 or 96 bus connections, depending upon whether there are 2 or 3 neighboring superblocks.

Figure 2:
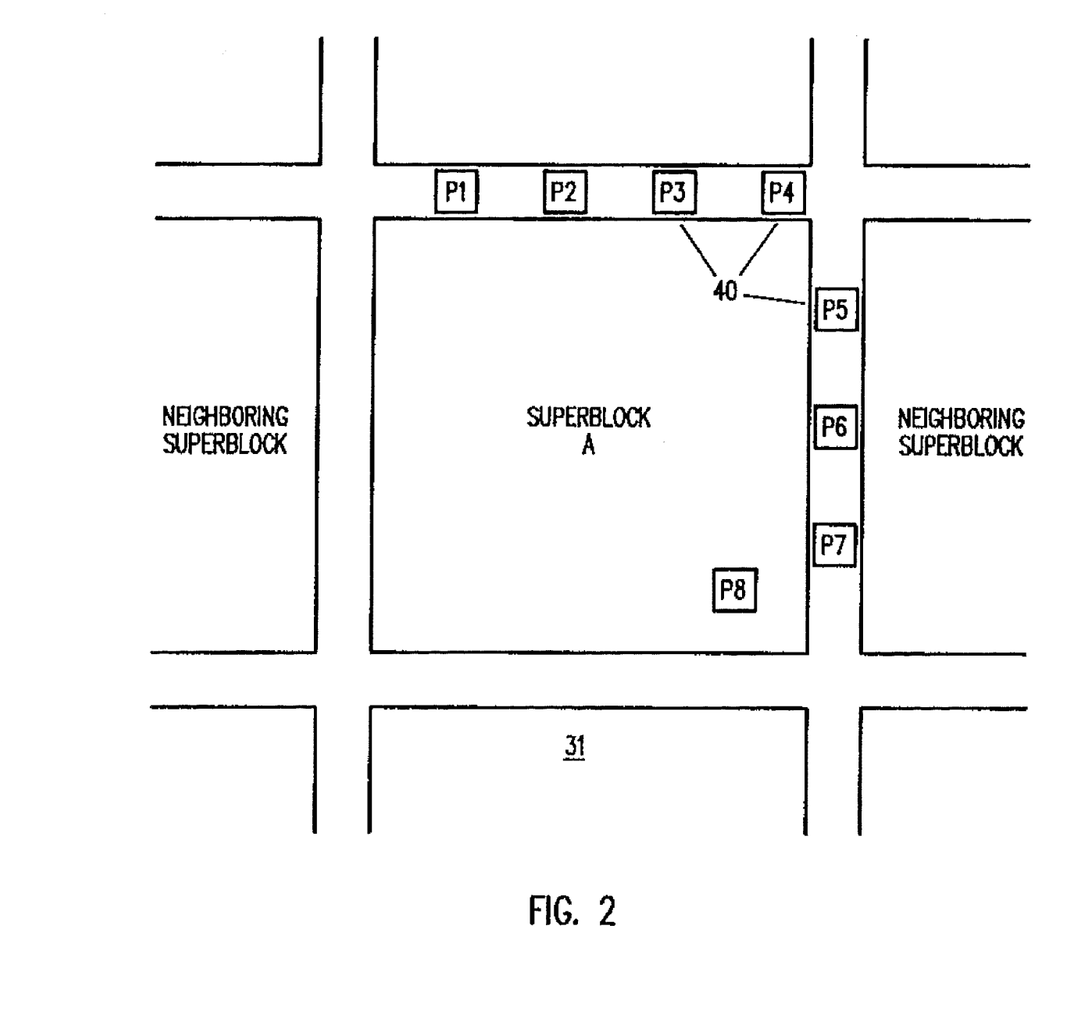
FIG. 2 shows a possible layout of interconnect pads to enable the logic cell arrays of FIGS. 1A–1C to be interconnected into more complex devices.

In order to overcome this inherent limitation on the number of interconnect paths, the smaller arrays of logic cells 31 can be adapted as shown in FIG. 2, which shows a possible layout of interconnect pads 40 to enable the logic cell arrays of FIGS. 1A–1C to be mounted on a substrate which serves to interconnect the arrays, thereby producing more complex devices.

In FIG. 2, each smaller array or superblock 31 is provided with numerous solder bump interconnection pads 40, where the pads are identified as P1 through P8 in the figure. Although not required, it is preferable to locate pads 40 above the active circuitry of arrays 31 with an insulating layer (not shown) between the interconnect pads and the array. The pads 40 are electrically connected through the insulating layer to points on arrays 31. This allows the pads to be interconnected to arrays 31 without increasing the surface area of the arrays and hence the surface area of the die or chip 30 formed from multiple arrays 31. Interconnect pads 40 are then electrically connected to similar pads on a multi-layer substrate which contains interconnect lines, allowing arrays 31 to be interconnected to other similar arrays in a desired manner. One option is to use interconnect pads 40 and the interconnect network of the substrate to electrically connect the express bus repeaters on one edge of a superblock to the corresponding repeaters on the edge of another superblock. This is shown in FIG. 2, in which interconnect pads 40 are placed above the repeaters to which they are connected, in this case every fourth repeater on the top and side of a superblock 31. If every superblock has interconnect pads distributed on its top and side (the right side in the example), the overall array 30 will have an evenly distributed pattern of interconnect pads superimposed on all of the superblocks in the array. This is desireable because for a random logic based system, such a distribution of interconnect points will yield the shortest average interconnect path between any two elements.

Figure 3:
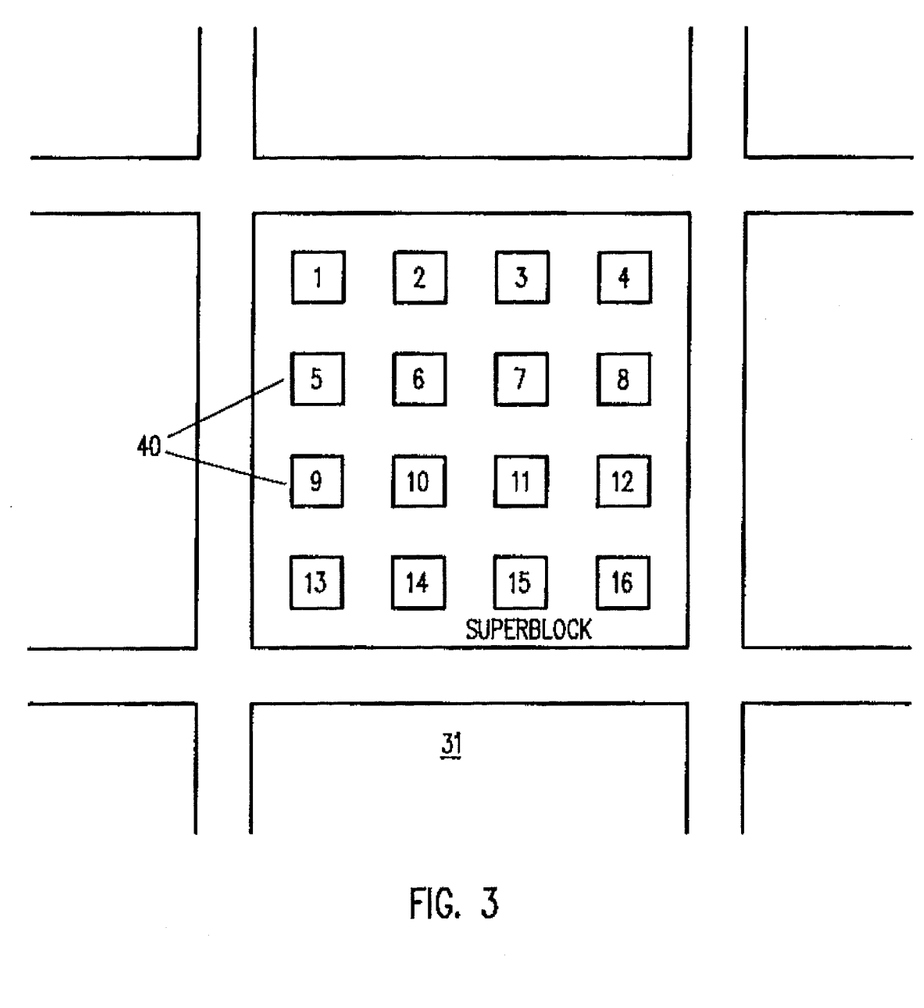
FIG. 3 shows a second possible layout of interconnect pads to enable the logic cell arrays of FIGS. 1A–1C to be interconnected into more complex devices.

FIG. 3 shows a second possible layout of interconnect pads to enable logic cell arrays 31 of FIGS. 1A–1C to be mounted on a substrate and interconnected into more complex devices. As shown in FIG. 3, a total of 16 interconnect pads 40 are electrically connected to points on array 31 to enable multiple arrays 31 to be interconnected into a higher capacity logic device. In the example shown in FIG. 3, interconnect pads 40 are again connected to the repeaters 38 which are part of the circuitry of array 31. As mentioned with regards to the pad layout of FIG. 2, it is preferable that pads 40 be placed on an insulating layer above array 31 and electrically connected through the insulating layer to the desired connection points on array 31 in order to maximize the surface area available for the active circuitry. In the embodiment of FIG. 3, interconnect pads 40 are connected to every other repeater 38 on the top and side of a superblock 31.

Figure 4:
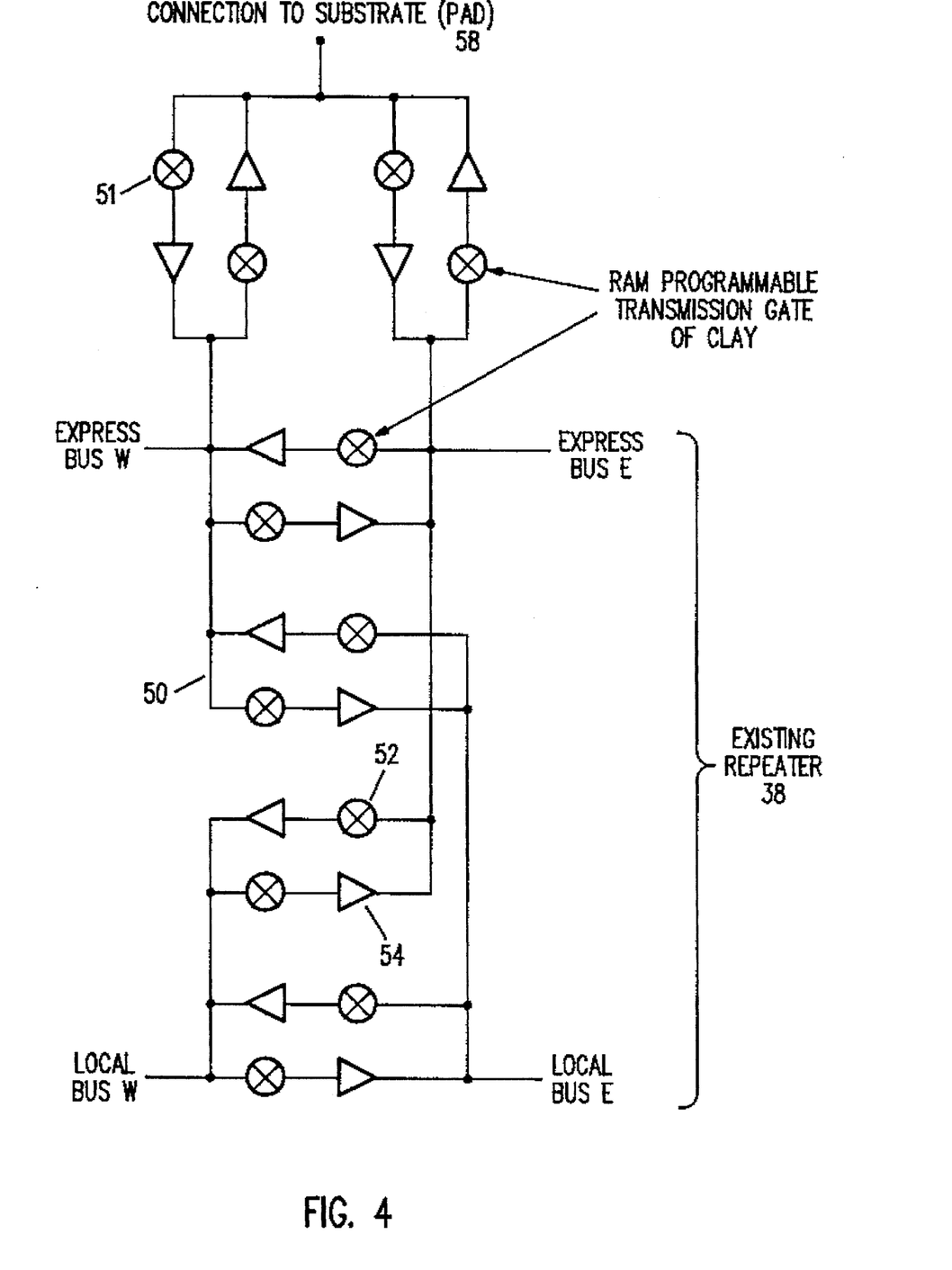
FIG. 4 shows how the logic cell arrays of FIGS. 1A–1C can be interconnected to a substrate in order to provide interconnections between multiple smaller logic cell arrays.

FIG. 4 shows in greater detail one method of interconnecting the logic cell arrays 31 of FIGS. 1A–1C to a substrate in order to provide interconnections between multiple smaller logic cell arrays. As indicated by FIG. 4, a repeater 38 consists of one or more switching units 50, where each switching unit 50 is composed of a programmable transmission gate 52 and a buffer 54. The switching units 50 permit signals to be routed amongst the different express or local buses connected to a repeater 38. In order to connect logic arrays 31 to the substrate, the repeaters 38 on array 31 are augmented with an additional set of switching units 51, thereby permitting signals to be routed between the substrate interconnect point or pad 58 and the repeater 38, where the connection between additional switching units 51 and repeater 38 is accomplished by means of interconnect pads 40 described previously. Additional switching units 51 are typically placed on the smaller arrays 31 or on the insulating layer separating the interconnect pads from the array.

With the addition of interconnect pads 40 as shown in FIG. 3, and a die 30 composed of a 7×7 array of superblocks 31, a pair of die 30 mounted on a substrate would gain a total of 784 (16×49) possible interconnects in addition to the 108 presently available. This would allow more cells to be used for active logic functions since fewer would be needed to function as interconnect wires, thereby increasing the degree of gate utilization. In addition, since fewer of the existing buses will be needed for interconnections, cells won't be disabled by the need to use their close-by buses for interconnections. It is important to note that this added connectivity is achieved with little, if any, increase in die size. The only increase would be that needed for the placement of the added switching units 51 shown in FIG. 4.

Figure 5:
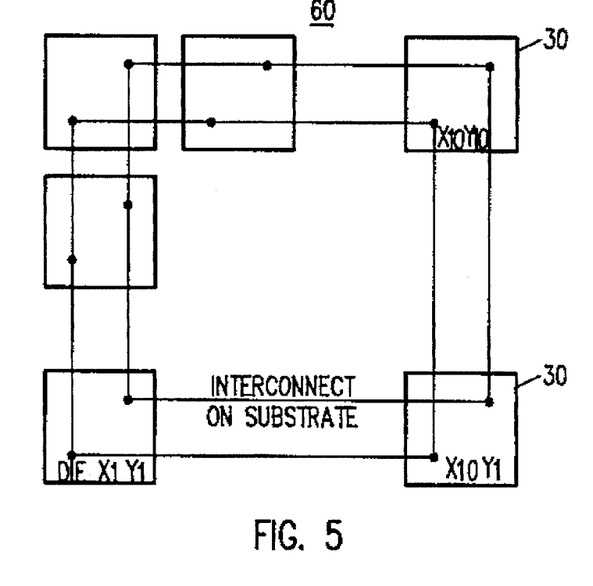
FIG. 5 shows a possible interconnect network for an array formed from multiple smaller programmable gate arrays or chips which are placed on a MCM substrate, where the substrate interconnect lines interconnect an equivalent point on each of the smaller arrays or chips.

The interconnect network embedded on or within the substrate determines how the individual arrays 31 are interconnected and how the resulting device operates in terms of functionality and capacity. FIG. 5 shows a possible interconnect network for an array 60 formed from multiple smaller programmable gate arrays or chips 30 which are placed on a MCM substrate, where the substrate interconnect lines interconnect corresponding points (interconnect pads) on each of the smaller arrays or chips. The result is a three dimensional interconnect network which is implemented in a two dimensional architecture. Such an interconnect network might be suited for a device having a bit-slice architecture where the same set of operations is performed on each bit of a multi-bit data word. The three dimensional interconnect scheme described here should have a shorter average propagation delay along an interconnect path when compared to existing two dimensional interconnect schemes in which interconnections between adjacent die can only be carried out by means of interconnect sites on the periphery of the die.

Figure 6:
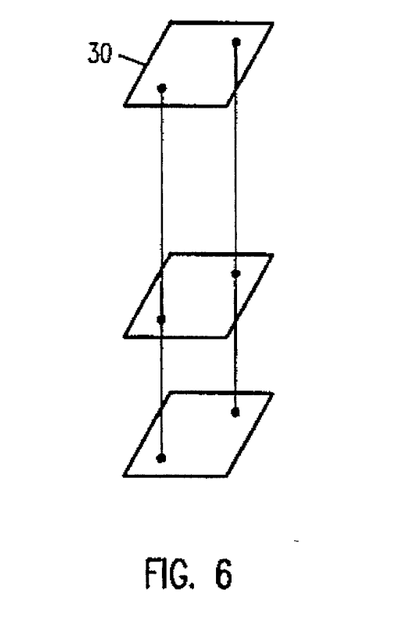
FIG. 6 shows the three dimensional analog of the two dimensional interconnect network shown in FIG. 5.

FIG. 6 shows the three dimensional analog of the two dimensional interconnect network shown in FIG. 5. As indicated in FIG. 6, the result of the interconnect scheme depicted in FIG. 5 is to produce a two dimensional equivalent of the result of stacking multiple smaller arrays 30 on top of each other and interconnecting corresponding points on each of the smaller arrays.

In accordance with the present invention, there are two primary benefits of adding interconnection pads to logic cell arrays 31 and mounting multiple dice 30 composed of such arrays on a substrate which allows the dice to be interconnected in a desired manner. Firstly, a higher degree of gate utilization can be realized, and secondly, signals can be routed among the arrays 31 and dice 30 over shorter interconnect lines, thereby reducing the average propagation delay between interconnected points and increasing the speed of operation of the final device.

Gate utilization is increased because connections can be made to interior array points or even to individual logic cells, instead of only to peripheral regions of a die. This means that the number and variety of possible interconnections is increased, thereby increasing the architectural complexity of the ultimate device. Propagation delays are decreased because instead of a signal having to propagate to the edge of a die or through multiple cells 12 and/or multiple repeaters 38 before being able to interconnect to another die or array, as is typically the case, the present invention provides a more even distribution of connecting points over the surface area of the component arrays and die. This arrangement acts to minimize the average interconnect length between elements located on two different die.

In addition to the three dimensional interconnect scheme described above in which points on different die are interconnected, one skilled in the art will appreciate that the substrate interconnect network can also be designed to electrically connect points on the same die. This may be especially useful in the case of devices such as field-programmable-gate-arrays which are designed to allow reconfiguration by the user to suit a specific application, because the inter-chip and intra-chip interconnect scheme is not shown at the time the chip is manufactured. For certain applications it may be desirable to increase the intra-chip interconnect capacity so that the existing interconnect capacity can be used primarily for inter-chip connections. This embodiment of the present invention is particularly suited to applications such as routing clock signals to multiple points on the same chip, where the same signal needs to be distributed to a large number of points with the requirement of minimal signal delay between each of the points.

This embodiment of the present invention would again involve the addition of solder bumps or contact pads to arrays 31 and then mounting die 30 composed of such arrays onto a substrate. However, in this embodiment, the substrate would contain an interconnect network which electrically connected points on the same die 30. Interconnections between different dice 30 would be implemented by cell-to-cell connections, bus lines, or other parts of the substrate interconnect network. The added interconnect capacity of this embodiment again supplements that available in the die as originally manufactured, thereby increasing the degree of gate utilization and reducing the propagation delay between points on the same die and on different die.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A three dimensionally extendible semiconductor based system, comprising:

a substrate having bonding pads for mounting a plurality of lower functional capacity elements, the bonding pads serving to electrically connect the lower functional capacity elements to the substrate and to each other through an interconnect network on or within the substrate, wherein the interconnect network electrically connects a contact point on a first lower functional capacity element to a corresponding contact point on a second lower functional capacity element; and a plurality of lower functional capacity elements mounted on the substrate to combine said elements into a higher functional capacity element, the lower functional capacity elements including a plurality of logic gates and having a three dimensionally extendible architecture and being adapted to allow mounting and interconnection thereof to the substrate by the inclusion of a plurality of bonding contact points placed on the lower functional capacity elements, the bonding contact points being evenly distributed over the surface of the lower functional capacity elements, whereby a high functional capacity element having a high degree of logic gate utilization and shortened average interconnect distances and propagation delays is produced.

2. The three dimensionally extendible system of claim 1, further comprising:

a plurality of input/output bonding pads on the lower capacity elements for electrically connecting the lower capacity elements to external pins on a mounting package.

3. The three dimensionally extendible system of claim 1, wherein the lower functional capacity units are gate arrays.

4. The three dimensionally extendible system of claim 3, wherein the gate arrays are field-programmable-gate-arrays (FPGAs).

5. The three dimensionally extendible system of claim 1, wherein the lower functional capacity elements have a peripheral region and an interior, and further, wherein an added bonding contact point is placed on the peripheral region of the lower functional capacity elements to allow mounting and interconnection of the lower capacity elements to the substrate.

6. The three dimensionally extendible system of claim 1, wherein the lower functional capacity elements have a peripheral region and an interior, and further, wherein an added bonding contact point is placed in the internal region of the lower functional capacity elements to allow mounting and interconnection of the lower capacity elements to the substrate.

7. The three dimensionally extendible system of claim 1, further comprising:

an insulating layer placed between a lower functional capacity element and an added bonding contact point, wherein the added bonding contact point is electrically connected to the lower functional capacity element.

8. A multi-chip-module package comprising:

a substrate having bonding pads for mounting a plurality of lower functional capacity elements, the bonding pads serving to electrically connect the lower functional capacity elements to the substrate and to an interconnect network on or within the substrate, wherein the interconnection network electrically connects a first contact point on a first lower functional capacity element to a second contact point on the first lower functional capacity element, and further wherein, the interconnection network electrically connects a third contact point on the first lower functional capacity element to a fourth contact point on a second lower functional capacity element; and a plurality of lower functional capacity elements mounted on the substrate to combine said elements into a higher functional capacity element, the lower functional capacity elements including a plurality of logic gates and being adapted to allow mounting and interconnection thereof to the substrate by the inclusion of a plurality of bonding contact points placed on the lower functional capacity elements, the bonding contact points being evenly distributed over the surface of the lower functional capacity elements, whereby a high functional capacity element having a high degree of logic gate utilization and shortened average interconnect distances and propagation delays is produced.

9. The multi-chip-module package of claim 8, further comprising:

a plurality of input/output bonding pads on the lower capacity elements for electrically connecting the lower capacity elements to external pins on a mounting package.

10. The multi-chip-module package of claim 8, wherein the lower functional capacity units are gate arrays.

11. The multi-chip-module package of claim 10, wherein the gate arrays are field-programmable-gate-arrays (FPGAs).

12. The multi-chip-module package of claim 8, wherein the lower functional capacity elements have a peripheral region and an interior, and further, wherein an added bonding contact point is placed on the peripheral region of the lower functional capacity elements to allow mounting and interconnection of the lower capacity elements to the substrate.

13. The multi-chip-module package of claim 8, wherein the lower functional capacity elements have a peripheral region and an interior, and further, wherein an added bonding contact point is placed in the internal region of the lower functional capacity elements to allow mounting and interconnection of the lower capacity elements to the substrate.

14. The multi-chip-module package of claim 8, further comprising:

an insulating layer placed between a lower functional capacity element and an added bonding contact point, wherein the added bonding contact point is electrically connected to the lower functional capacity element.

15. The three dimensionally extendible system of claim 1, wherein each of the bonding contact points on each of the lower functional capacity elements has a unique identifier associated therewith, with the same identifier being assigned to equivalent contact points on different lower capacity elements, and further wherein, the interconnect network electrically connects a contact point having a given identifier on a first one of the lower capacity elements to a contact point having the same identifier on a second one of the lower capacity elements.

* * * * *